United States Patent [19]

Brewerton

[11] 4,163,940

[45] Aug. 7, 1979

[54] ELECTRICAL MEASUREMENT AND NOISE SUPPRESSION

[75] Inventor: David Brewerton, Bracknell, England

[73] Assignee: Racal Instruments Limited, Bracknell, England

[21] Appl. No.: 675,863

[22] Filed: Apr. 12, 1976

[30] Foreign Application Priority Data

Sep. 15, 1975 [GB] United Kingdom ............... 37901/75

[51] Int. Cl.² ...................... G01R 15/10; H04B 1/04
[52] U.S. Cl. .................................. 324/132; 324/120; 328/144; 328/163
[58] Field of Search ............... 324/120, 132, 130, 131, 324/74; 328/163, 144, 145

[56] References Cited

U.S. PATENT DOCUMENTS

| | | | |
|---|---|---|---|
| 2,881,379 | 4/1959 | Logan, Jr. ............................ | 324/132 |
| 3,257,616 | 6/1966 | Andrushkiw et al. ................ | 324/131 |
| 3,423,578 | 1/1969 | Platzer, Jr. et al. .................. | 324/132 |
| 3,619,794 | 11/1971 | Richman ............................... | 328/144 |
| 3,955,139 | 5/1976 | Jenkins et al. ........................ | 324/130 |

Primary Examiner—Rudolph V. Rolinec
Assistant Examiner—Ernest F. Karlsen
Attorney, Agent, or Firm—Leydig, Voit, Osann, Mayer & Holt, Ltd.

[57] ABSTRACT

Electrical noise is suppressed on an input signal by squaring the input signal and any noise thereon, removing the sinusoidal terms in the squared output (as by averaging), subtracting the d.c. noise component, and taking the square root of the remainder, so as to produce an r.m.s. dependent, substantially noise free output. If desired, the noise suppression circuitry may be combined in a low signal measuring instrument in which the input signal is repetitively sampled and freed of noise in the manner described, the output then being measured on a d.c. meter.

5 Claims, 2 Drawing Figures

ELECTRICAL MEASUREMENT AND NOISE SUPPRESSION

BACKGROUND OF THE INVENTION

The invention relates to electrical circuitry and methods. More particularly, the invention relates to circuitry for measuring low signals and suppressing noise.

BRIEF SUMMARY OF THE INVENTION

According to the invention, there is provided noise suppression circuitry, comprising squaring means for taking the square of an input signal and noise thereon, means for algebraically adding to the resultant output a noise suppression signal which offsets the d.c. noise component in the said resultant output, means for removing the sinusoidal terms from the resultant output, and means for taking the square root of the remainder of the resultant output, whereby the square root represents the r.m.s. value of the original input signal.

According to the invention, there is further provided a method of suppressing noise when combined with an input signal, comprising the steps of taking the square of the input signal and the noise, whereby to produce a resultant output which contains d.c. terms dependent respectively on the square of the input signal and the noise and sinusoidal terms dependent on functions of the input signal and the noise and their squares, subtracting from the said resultant output the d.c. noise term, removing the sinusoidal terms (either before or after the subtracting step) so as to leave only a term dependent on the square of the input signal, and taking the square root of the latter term.

According to the invention, there is also provided electrical measurement circuitry, comprising means for sampling an input signal whose magnitude is to be measured whereby to produce a succession of samples of the input signal, means for deriving a variable waveform dependent on the changes in level of the said samples, means for taking the mean square value of the said variable signal and subtracting therefrom a signal dependent on the mean square noise component thereof, and means for measuring the square root of the resultant signal.

DESCRIPTION OF THE DRAWINGS

Electrical measurement circuitry, for measuring very low voltages, and embodying the invention, will now be described by way of example only and with reference to the accompanying diagrammatic drawings in which.

DESCRIPTION OF PREFERRED EMBODIMENTS

Figure 1:
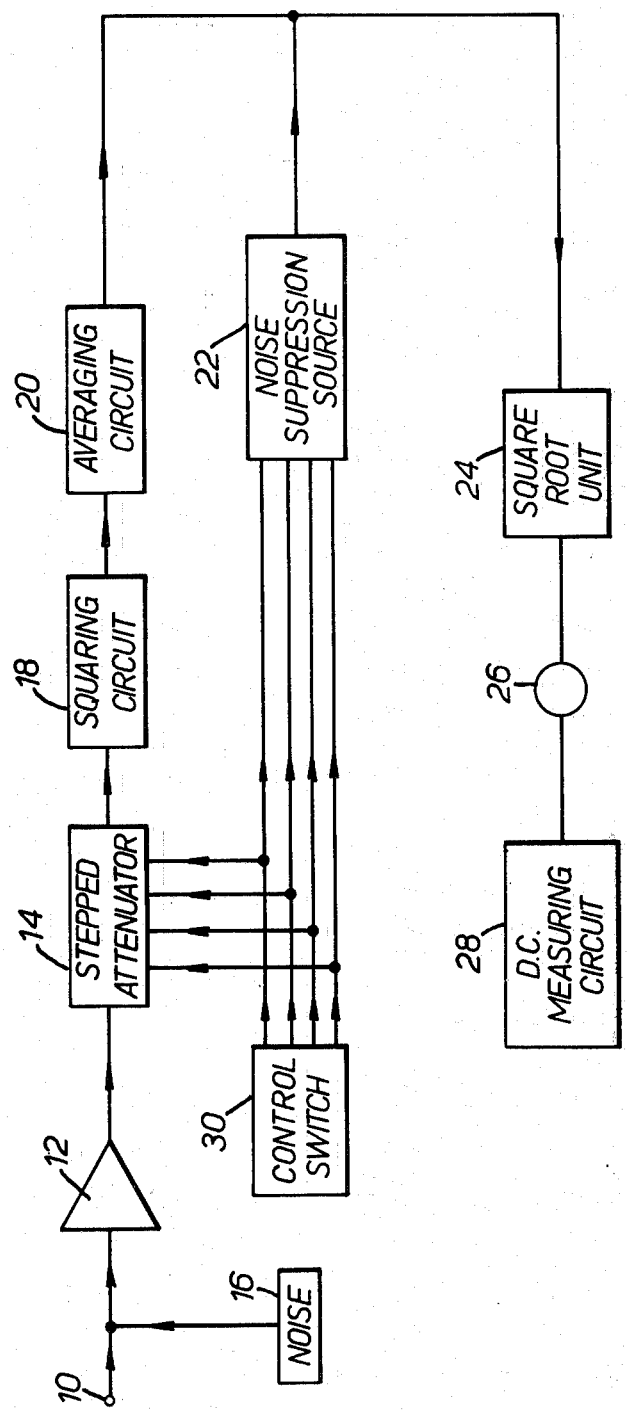
FIG. 1 is a block circuit diagram of one form of the circuitry showing the noise suppression part thereof in detail.
Figure 2:
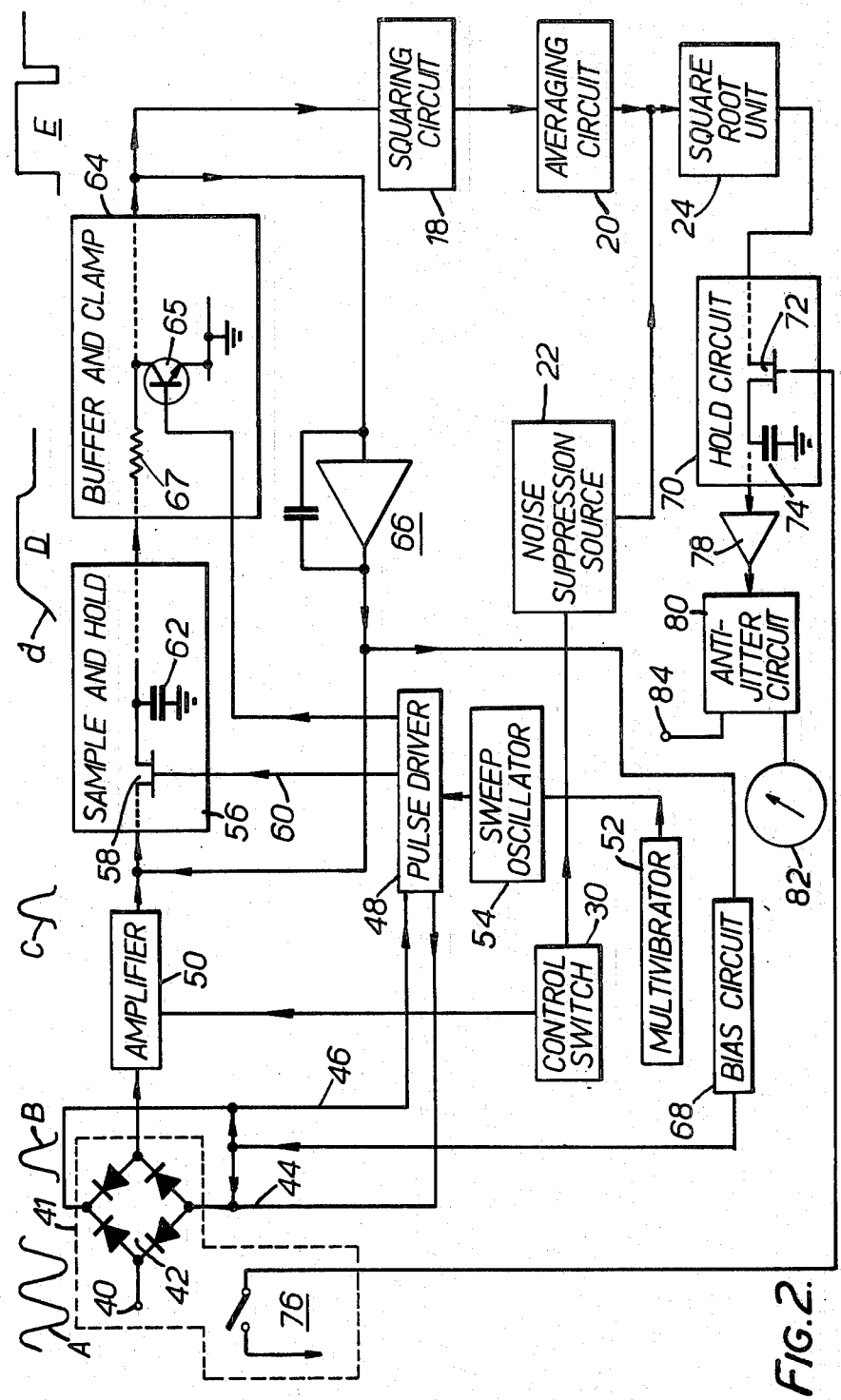
FIG. 2 is a block circuit diagram of a modified form of the circuitry of FIG. 1 but showing the signal measuring parts of the circuitry in greater detail.

The circuitry of FIG. 1 is for measuring very low voltages which are received at an input terminal 10. The input signals may be directly received at the input terminal 10 or they may be processed in some way before being received. For example (and as shown in FIG. 2, to be described below), the input signals may be sampled before application to the terminal 10, the sampled amplitudes being applied to the terminal 10.

The input signals are then applied to a buffer amplifier 12 and then to a stepped and switchable attenuator 14 for range changing. A noise source 16 is shown which injects noise to the system. Although the source 16 is shown as a discrete source, in practice, of course, noise could arise at various points in the circuitry (either before or after the input terminal 10). In a manner to be described, the circuitry incorporates means for suppressing this noise.

The output (containing the input signal and the noise to be suppressed) from the attenuator 14 is then applied to a squarer circuit 18.

The total signal T applied to the input to the squaring circuit 18 can be considered to have the form $$T = I \sin \omega_1 t + N \sin (\omega_2 t + \theta) \quad (1)$$

where the first term is the input signal to be measured and the second term is the noise signal. After passing through the squarer circuit 18, the resultant output is $$T^2 = I^2 \sin^2 \omega_1 t + N^2 \sin^2(\omega_2 t + \theta) + 2NI \sin \omega_1 t \cdot \sin(\omega_2 t + \theta) \quad (2)$$

$$= (I^2/2) - (I^2/2) \cos \cdot 2\omega_1 t + (N^2/2) - (N^2/2) \cos \cdot 2(\omega_2 t + \theta) + 2NI \sin \omega_1 t \cdot \sin(\omega_2 t + \theta) \quad (3)$$

The signal $T^2$ then passes through an averaging circuit 20 which consequently removes all the sine and cosine terms.

A precision controlled noise suppression d.c. signal, derived from a signal source 22, is then algebraically added to the output of the squarer 18. The source 22 is arranged to produce a signal which is equal to $-(N^2/2)$ and therefore cancels the term $N^2/2$ in Equation (3).

The resultant signal, now comprising substantially only the term $I^2/2$, is fed into a square root circuit 24 which takes the square root of the signal received. The output terminal 26 is therefore proportional to I alone, that is, the noise has been suppressed.

The final d.c. output at terminal 26 is then measured in any suitable way, such as by means of suitable measuring circuitry 28.

When a change in the range of the measurement circuitry is made, by adjusting the division factor of the attenuator 14 using a control switch 30, it will be appreciated that there will be a consequent change in the signal to noise ratio in the input applied to the squarer 18. Thus, for example, if the input signal to be measured, as applied to the terminal 10, is increased by a factor of ten, so that the division factor of the attenuator 14 is increased by a factor of ten, then the noise at the input of the squarer 18 will be reduced by a factor of ten. In order to provide correct compensation, it is therefore necessary to reduce the noise suppression signal from the source 22 by a factor of $10^2$, that is, 100. This adjustment of the noise suppression voltage is achieved automatically by connections to the source 22 from the switch 30 as shown in the drawing.

The squarer 18, the averaging circuit 20, and the square root circuit 24 can take any suitable form, as individually known in the art. For example, the squarer 18 may comprise a precision full wave rectifier followed by a known type of "log-antilog" squaring circuit; the precision rectifier reduces the maximum amplitude of the signal to be handled. Similarly, the square root circuit 24 may comprise a known type of "log-antilog" circuit.

It may be advantageous to provide manually operable means for adjusting the magnitude of the noise suppression signal from the source 22, to enable an operator to null the noise (as by nulling an output meter in the absence of an input signal). In this way, substantially complete noise suppression can be obtained and will subsequently be substantially maintained over the full measurement scale, even when a range change takes place.

As stated above, the circuit of FIG. 1 may be used with advantage in the case where the input signals received at terminal 10 are signal samples. FIG. 2 shows circuitry particularly adapted to sample an input signal and to measure the samples. The circuitry of FIG. 2 includes the noise suppression circuitry of FIG. 1, and items in FIG. 2 which correspond to items in FIG. 1 are correspondingly referenced.

As shown in FIG. 2, an input signal to be measured is applied to a terminal 40 of a probe 41 incorporating a rectifier bridge network 42. The bridge is normally non-conductive but is repetitively rendered conductive by sampling pulses applied across two of its diagonally opposite terminals by means of lines 44 and 46 which are connected to a pulse driver network 48. The effect is, therefore, that each such sampling pulse renders the bridge conductive and conducts a sample of the input signal (at the terminal 40) to a variable gain amplifier 50 which is adjustable (like the attenuator 14 in FIG. 1) to vary the sensitivity of measurement.

The pulse driver network 48 is driven by a multivibrator 52 and a sweep oscillator 54 which are arranged to ensure that the sampling pulses produced have a pseudo-random frequency. In this way, the statistical information about the input signal is fully preserved in the samples of the input signal and can thus be measured (as will be described), even though the waveform of the input signal is not preserved (as it would be if the sampling pulses had a constant frequency).

From the variable gain amplifier 50, the signal samples are applied to a sample and hold circuit 56. As shown diagrammatically, this may comprise an FET 58 whose conduction is controlled from the pulse driver network 48 via a line 60, and applies the signal samples to a capacitor 62. The voltage across the capacitor 62 is then passed to a buffer and clamp circuit 64 whose output feeds the squaring circuit 18 of the noise suppression circuitry described with reference to FIG. 1.

A feedback loop between the buffer and clamp circuit 64 and the sample and hold circuit 56 is provided and incorporates an integrator circuit 66. A parallel feedback path is connected from the output of the integrator 66 to the probe 41 via a balancing and biasing circuit 68.

The r.m.s. output from the square root unit 24 is fed to a hold circuit 70 which comprises an FET 72 connected to control the application of the measured signal across a capacitor 74. The conduction of FET 72 is controlled by means of a manually operated switch 76 mounted, for example, on the probe 41.

The signal as stored in capacitor 74 is then fed via a buffer amplifier 78, to an anti-jitter circuit 80 and thence to the meter 82 and a separate d.c. output terminal 84.

The anti-jitter circuit may comprise a known type of dual-time constant circuit which is arranged to damp small signal fluctuations (due mainly to the sampling action) while passing large signal fluctuations undamped.

The operation of the measuring circuitry will now be described with the aid of the waveforms illustrated by way of example in FIG. 2.

It is assumed for the purposes of explanation that the input signal is sinusoidal, as shown at A, though this is not essential.

In response to each sampling pulse from the pulse driver network 48, the bridge 42 is rendered conductive and a sample of the input voltage is applied to the variable gain amplifier 50, the waveform of the sample being as shown at B. A similar waveform (waveform C) will therefore appear at the output of the variable gain amplifier 50, there being merely a change in amplitude in accordance with the setting of the attenuator, and waveform C is applied to the sample and hold circuit 56.

Simultaneously with the application of the signal sample to the circuitry 56 the FET 58 is rendered conductive by the network 48 via the line 60. The signal sample is therefore applied across capacitor 62 and charges up the capacitor as shown at d in waveform D. At the end of the sampling pulse, line 60 is de-energised and the FET 58 becomes non-conductive, thereby preserving the charge on the capacitor 62 (as shown in waveform D) until the next sampling pulse occurs. At the latter time, FET 58 is rendered conductive again and the voltage on capacitor 62 changes to the new level corresponding to the magnitude of the next signal sample.

The buffer and clamp circuitry 64 incorporates a transistor 65 whose conduction is controlled by the pulse driver network 48 so that transistor 65 is held conductive (and therefore blocks the passage of the waveform D) until FET 58 has been rendered non-conductive. A buffer resistor 67 associated with the clamp transistor 65 in the buffer and clamp circuitry 64 provides the necessary buffering between the capacitor 62 and ground when transistor 65 is conductive. The effect is, therefore, to convert the waveform D into the waveform E, eliminating the exponential changes in level due to the charging of capacitor 62. Waveform E is the waveform applied to the squaring circuit 18.

The feedback circuitry incorporating the integrator 66 is provided to offset changes in d.c. level, firstly in the loop comprising the sample and hold circuitry 56 and the buffer and clamp circuit 64, and secondly in the larger loop including the probe 41 and the variable gain attenuator 14. Any d.c. offset tending to be produced at the output of the buffer and clamp circuit 64 is integrated and fed back both to adjust the bias voltage on the diodes in the bridge 42 and to adjust the level in the circuitry 56, so as to eliminate the d.c. offset. It will be appreciated that the larger of the two feedback loops incorporates the variable gain amplifier 50 which thus has the effect of increasing the sensitivity of the corrective action applied to be probe 41, compared to that applied to the circuitry 56, at low signal levels.

The action of the noise suppression circuitry comprising the squaring circuit 18, the averaging circuit 20, the square root unit 24, and the noise suppression source 22, has previously been described with reference to FIG. 1.

The hold circuit 70 enables an operator to maintain a meter reading by closing the probe switch 76. This switches off the FET 72 so that the previously stored signal value on capacitor 74 is held unchanged by fresh signal samples and can be read on the meter 82.

What I claim is:

1. Noise suppression circuitry for suppressing noise on an input signal of undetermined frequency, comprising
scaling means connected to receive the input signal and adjustable to a setting in which it changes the magnitude of the input signal and any noise thereon by a predetermined factor,
squaring means connected to the scaling means to receive and to take the square of the input signal, and the noise thereon, as received via the adjustable scaling means,
a d.c. signal source settable to produce a d.c. signal,
adding means responsive to the d.c. signal for algebraically adding the latter as a noise suppression signal to the resultant output of the squaring means, the noise suppression signal being selected to offset the d.c. noise component in the said resultant output,
means connected to the scaling means and to the d.c. signal source and responsive to any said change in magnitude imposed on the input signal and the noise thereon by the scaling means for altering the magnitude of the said noise suppression signal in the opposite direction to the change in magnitude of the input signal by a factor which is equal to the square of the said predetermined factor,
means for removing the sinusoidal terms from the sinusoidal output of the squaring means, and
means for taking the square root of the remainder of the said resultant output, whereby the square root represents the r.m.s. value of the original input signal.

2. Electrical measurement circuitry for measuring an input signal of undetermined frequency, comprising
sampling means connected to periodically sample the input signal whereby to produce a succession of samples of the input signal,
storage means connected to receive the samples and to temporarily store the level of each sample until the next sample is received whereby to derive a variable waveform dependent on the changes in level of the said samples,
squaring means for taking the mean square value of the said variable signal and the noise thereon so as to produce an output including a mean square noise component,
a d.c. signal source settable to produce a d.c. signal,
means subtracting the d.c. signal from the output of the squaring means so as to offset the said mean square noise component thereof, and
means for measuring the square root of the resultant signal.

3. Circuitry according to claim 2, in which the storage means connected to receive the signal samples for deriving the variable waveform comprises
capacitive storage means,
switch means,
means responsive to the said sampling means to close the switch means whereby to apply each signal sample across the capacitive storage means to adjust the charge thereon,
means responsive to the end of each sampling pulse to open-circuit the switch means whereby to maintain the charge on the capacitive storage means until the next sampling pulse,
further switch means,
high impedance buffer and clamping means connected to sense the charge across the capacitive storage means through the further switch means, and
means for holding the further switch means open-circuit during each sampling pulse but closing it at the end thereof whereby to block the exponential changes in voltage across the capacitive storage means.

4. Circuitry according to claim 2, including feedback means responsive to any d.c. offset in the said variable signal for negatively feeding back and thereby cancelling the said d.c. offset.

5. Circuitry according to claim 3, including negative feedback means comprising two parallel feedback paths fed from the output of the buffer and clamping means, one connected back to the capacitive storage means and the other connected back to the sampling means, the said paths having a common portion including an integrator circuit, whereby to negatively feed back and back off any d.c. offset at the output of the buffer and clamping means.

* * * * *